United States Patent
Mii et al.

(10) Patent No.: US 7,821,140 B2
(45) Date of Patent: Oct. 26, 2010

(54) SEMICONDUCTOR DEVICE AND WIRE BONDING METHOD

(75) Inventors: Tatsunari Mii, Tokyo (JP); Hayato Kiuchi, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 12/727,812

(22) Filed: Mar. 19, 2010

(65) Prior Publication Data

US 2010/0237480 A1 Sep. 23, 2010

Related U.S. Application Data

(63) Continuation of application No. PCT/JP2008/055484, filed on Mar. 25, 2008.

(30) Foreign Application Priority Data

Sep. 21, 2007 (JP) ............................. 2007-246033

(51) Int. Cl.
*H01L 23/48* (2006.01)
*H01L 21/44* (2006.01)

(52) U.S. Cl. ..................... 257/784; 257/777; 257/666; 257/E23.024; 257/E21.509; 438/617

(58) Field of Classification Search ................. 257/784, 257/777, 666, E23.024, E23.141, E21.509; 438/617

See application file for complete search history.

(56) References Cited

U.S. PATENT DOCUMENTS

| 5,172,851 | A | * | 12/1992 | Matsushita et al. | ..... 228/180.22 |
| 5,299,729 | A | * | 4/1994 | Matsushita et al. | ..... 228/180.22 |
| 5,566,876 | A | * | 10/1996 | Nishimaki et al. | .......... 228/102 |
| 6,316,838 | B1 | | 11/2001 | Ozawa et al. | |
| 6,946,380 | B2 | * | 9/2005 | Takahashi | ................... 438/612 |
| 7,064,425 | B2 | | 6/2006 | Takahashi et al. | |
| 7,314,818 | B2 | | 1/2008 | Takahashi et al. | |
| 2002/0117330 | A1 | * | 8/2002 | Eldridge et al. | ............. 174/260 |

(Continued)

FOREIGN PATENT DOCUMENTS

JP 2000124391 4/2000

(Continued)

OTHER PUBLICATIONS

Notification of Reason(s) for Refusal dated Jun. 30, 2009 from corresponding Japanese Application No. JP 2007-246033.

(Continued)

*Primary Examiner*—Nitin Parekh
(74) *Attorney, Agent, or Firm*—Katten Muchin Rosenman LLP

(57) ABSTRACT

A semiconductor device has a first layer pressing portion that is formed by crushing a ball neck formed by bonding an initial ball onto a first layer pad of a first layer semiconductor die and pressing the side of a wire folded onto the crushed ball neck, a first wire extended in the direction of a lead from the first layer pressing portion, and a second wire that is looped from a second layer pad of a second layer semiconductor die toward the first layer pressing portion and joined onto the second layer pad side of the first layer pressing portion. Thereby, the connection of wires is performed at a small number of times of bonding, while reducing damages caused on the semiconductor dies.

6 Claims, 14 Drawing Sheets

U.S. PATENT DOCUMENTS

| | | | |
|---|---|---|---|
| 2003/0155405 A1 | 8/2003 | Takahashi | |
| 2003/0166333 A1* | 9/2003 | Takahashi | 438/617 |
| 2004/0026480 A1 | 2/2004 | Imai et al. | |
| 2004/0152292 A1* | 8/2004 | Babinetz et al. | 438/617 |
| 2006/0175383 A1* | 8/2006 | Mii et al. | 228/180.5 |
| 2007/0158392 A1* | 7/2007 | Shimanuki | 228/101 |
| 2008/0054052 A1* | 3/2008 | Arakawa | 228/244 |

FOREIGN PATENT DOCUMENTS

| | | |
|---|---|---|
| JP | 2001127246 | 5/2001 |
| JP | 2003243442 | 8/2003 |
| JP | 2004071983 | 3/2004 |
| JP | 2005116961 | 4/2005 |
| JP | 2005340777 | 12/2005 |

OTHER PUBLICATIONS

International Search Report dated Jul. 1, 2008 from corresponding International Application No. PCT/JP2008/055484.

* cited by examiner

SEMICONDUCTOR DEVICE AND WIRE BONDING METHOD

TECHNICAL FIELD

The present invention relates to a structure of a semiconductor device and a wire bonding method.

BACKGROUND ART

In recent years, due to the demands for semiconductor devices with increased capacity, stacked semiconductor devices configured by a plurality of semiconductor dies stacked over a lead frame have been more commonly used. Further, as reduction in thickness and size is also desired for such a stacked semiconductor device, a wire bonding method of sequentially connecting between pads of adjacent semiconductor dies or a pad of a semiconductor die and a lead of a lead frame is employed, for example, as described in Japanese Patent No. 3573133, instead of individually connecting a pad of a semiconductor die of each layer and a lead frame. According to this method, in order to reduce damages caused on the semiconductor dies during wire bonding, the wire is sequentially connected to the pads of the semiconductor dies up to an uppermost layer from the lead frame by first forming a bump on the pad of each semiconductor die, then performing reverse bonding from the lead on the lead frame to the pad of a semiconductor die, and further performing another reverse bonding from the bump to which the bonding has been performed to the bump of an adjacent semiconductor die.

Moreover, as described in Japanese Patent No. 3869562, for example, it has been proposed a method of connecting a wire by forming a bump that reduces damages caused on a semiconductor die when bonding only on a pad surface of an intermediate layer of a stacked semiconductor device, performing ball bonding to a pad of a semiconductor die at an uppermost layer, looping a wire onto the bump that has been formed on the pad of the intermediate layer and bonding the wire onto the bump, further looping the wire continuously, and performing stitch bonding onto a pad or a lead of an adjacent intermediate layer.

However, the conventional technique described in Japanese Patent No. 3573133 performs the wire bonding after the bumps are formed on the pads of the semiconductor dies, and there is a problem that it takes time and cost for bonding as a number of steps is large. For example, the connection between the pads and the lead of a stacked semiconductor in which two layers are stacked involves four steps in total: steps of forming bumps respectively on the pads of the semiconductor dies in the two layers (two steps), bonding between the lead and the bump on the pad of a semiconductor die of a first layer, bonding between the bump of the first layer and the bump on the pad of the semiconductor die of a second layer. Further, the conventional technique described in Japanese Patent No. 3869562 performs the bonding after the bump is formed only on the pad of the semiconductor die of the intermediate layer and requires a bump forming process in addition to the bonding process, and therefore the technique does not address the problem of the increased number of steps, even though the number of steps in the bonding process is smaller than that in the conventional technique described in Japanese Patent No. 3573133.

The present invention aims to provide connection of a wire in a semiconductor device with a smaller number of times of bonding while reducing damage caused to the semiconductor dies.

DISCLOSURE OF THE INVENTION

A semiconductor device according to the present invention is a semiconductor device in which two bonding points out of three or more bonding points are connected with a wire, the semiconductor device comprising: a pressing portion that is formed by bonding an initial ball formed at a tip end of a wire that is inserted through a capillary and protrudes from a tip or lower end of the capillary onto a first bonding point, crushing a ball neck formed by the bonding, and pressing a side surface of the wire folded back onto the crushed ball neck; a first wire that extends from the pressing portion to a second bonding point; and at least one second wire that is looped toward the pressing portion from at least one third bonding point and joined onto the pressing portion at a position on a side facing to the corresponding third bonding point, each third bonding point being provided at a position in a direction different from a direction of the second bonding point centering the first bonding point.

A semiconductor device according to the present invention is a semiconductor device that includes semiconductor dies that are stacked on a lead frame and that sequentially connects either between pads of adjacent ones of the semiconductor dies or between a pad of the semiconductor die and a lead of the lead frame with a wire, the semiconductor device comprising: a pressing portion that is formed by bonding an initial ball formed at a tip end of a wire that is inserted through a capillary and protrudes from a tip or lower end of the capillary onto a pad of a first semiconductor die, crushing a ball neck formed by the bonding, and pressing a side surface of the wire folded back onto the crushed ball neck; a first wire that extends from the pressing portion to a direction of a pad of a second semiconductor die that is adjacent on a side facing either to the lead or to the lead frame; and a second wire that is looped toward the pressing portion from a pad of a third semiconductor die and joined onto the pressing portion at a position on a side facing to the pad of the third semiconductor die, the third semiconductor die being adjacent to the first semiconductor die on a side facing away from the lead frame.

According to the semiconductor device of the present invention, it is preferable that the second wire is joined onto the pressing portion with a face portion of the capillary by downward movement of the capillary, deformed due to a pressing force of the capillary, and sandwiched and compressed between a projected portion intruded into a center hole of the capillary and an inner chamfer portion of the capillary, or that the second wire has a cut surface along the projected portion that is formed into a shape that fits along a shape of the center hole of the capillary due to the pressing force of the capillary.

A wire bonding method according to the present invention is a wire bonding method of connecting two bonding points out of three or more bonding points with a wire, the method comprising: a ball bonding step of bonding an initial ball onto a bonding point, the initial ball being formed at a tip end of a wire that is inserted through a capillary and protrudes from a tip or lower end of the capillary; a crushing step of crushing a ball neck that has been formed in the ball bonding with the tip end of the capillary; a pressing step of folding back the wire on the ball neck that has been crushed by the capillary and pressing a side surface of the wire against the crushed ball neck; a first wire forming step of feeding the wire from the capillary and then looping the wire toward a second bonding point, thereby forming a first wire that is directed toward the second bonding point; and a second wire joining step of looping the wire toward a pressing portion from at least one third bonding point, thereby joining a second wire to the pressing portion at a position on a side facing to the third bonding point, the third bonding point being provided at a position in a direction different from a direction of the second bonding point centering the first bonding point.

A wire bonding method according to the present invention is a wire bonding method of sequentially connecting either between pads of adjacent ones of semiconductor dies that are stacked on a lead frame or between a pad of the semiconductor die and a lead of the lead frame with a wire, the method comprising: a ball bonding step of bonding an initial ball onto a pad on a first semiconductor die, the initial ball being formed at a tip end of a wire that is inserted through a capillary and protrudes from a tip or lower end of the capillary; a crushing step of crushing a ball neck that has been formed in the ball bonding with the tip end of the capillary; a pressing step of folding back the wire on the ball neck that has been crushed by the capillary and of pressing a side surface of the wire against the crushed ball neck; a first wire forming step of feeding the wire from the capillary and then looping the wire toward a pad of an adjacent second semiconductor die on a side facing either to the lead or to the lead frame, thereby forming a first wire that is directed either toward the lead or toward the pad of the second semiconductor die; and a second wire connecting step of looping the wire toward a pressing portion from a pad of a third semiconductor die, thereby joining a second wire to the pressing portion at a position on a side facing to the pad of the third semiconductor die, the third semiconductor die being adjacent to the first semiconductor die on a side facing away from the lead frame.

According to the wire bonding method of the present invention, it is preferable that the second wire connecting step includes: moving the capillary downward with a pressing force and joining the second wire to the pressing portion with a face portion of the capillary, deforming the pressing portion having an outer diameter larger than an inner diameter of a center hole of the capillary into a projected portion that intrudes into the center hole of the capillary by the pressing force of the capillary, and sandwiching and compressing the second wire between the projected portion intruded into the center hole of the capillary and an inner chamfer portion of the capillary.

The present invention provides an advantageous effect that a wire can be connected with a smaller number of times of bonding while reducing damages caused on a semiconductor die in a semiconductor device.

DETAILED DESCRIPTION OF THE INVENTION

Figure 1:
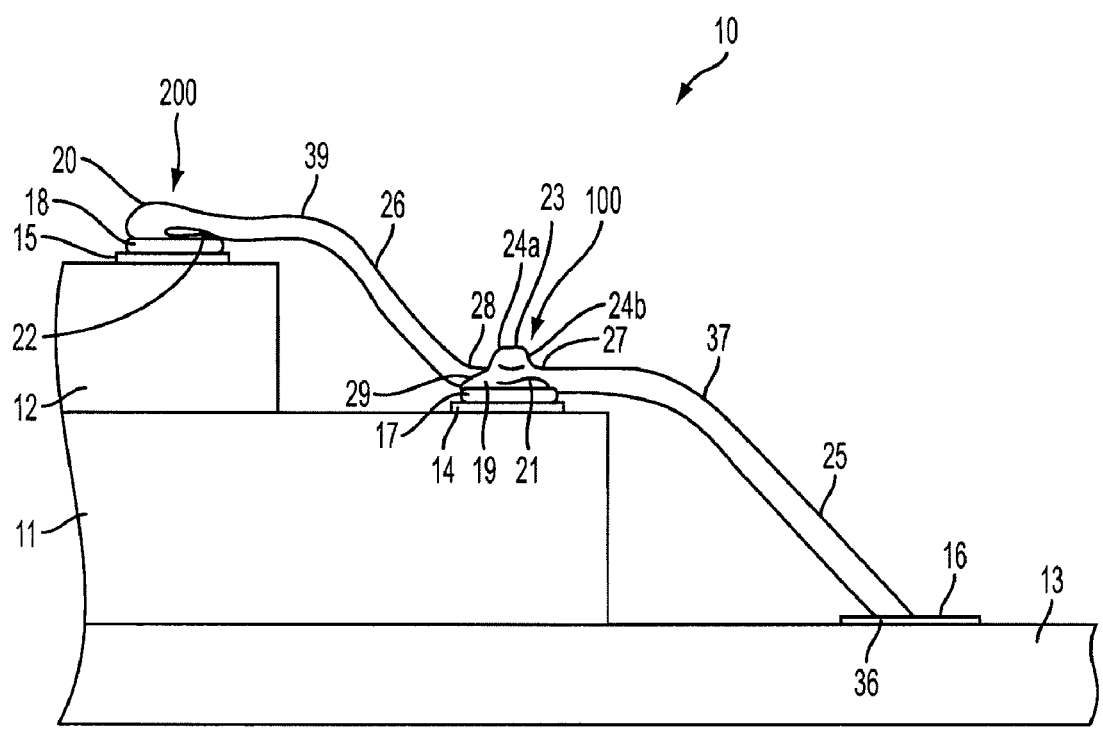
FIG. 1 is a side view illustrating a semiconductor device of an embodiment according to the present invention.

The following describes preferred embodiments according to the present invention with reference to the drawing. FIG. 1 shows an embodiment in which the present invention is applied to a stacked semiconductor device 10. As shown in FIG. 1, the semiconductor device 10 has a two-layer stack structure in which a first-layer semiconductor die 11 as a first semiconductor die and a second-layer semiconductor die 12 as a second semiconductor die whose size is smaller than the first-layer semiconductor die 11 are stacked on a lead frame 13 and joined to each other. The first-layer semiconductor die 11 is provided with a first layer pad 14 as a first bonding point on its surface, the second-layer semiconductor die 12 is provided with a second layer pad 15 as a third bonding point on its surface, and the lead frame 13 is provided with a lead 16 as a second bonding point on its surface.

There is a leveled step that corresponds to a thickness of the second-layer semiconductor die 12 between the pads 14, 15 respectively provided on the surfaces of the semiconductor dies 11, 12, and there is a leveled step that corresponds to a thickness of the first-layer semiconductor die 11 between the pad 14 of the first-layer semiconductor die 11 and the lead 16. Further, the second-layer semiconductor die 12 is smaller than the first-layer semiconductor die 11. The second layer pad 15, the first layer pad 14, and the lead 16 are disposed in the stated order in a plane along surfaces of the pads 14, 15 or the lead 16, and the second layer pad 15, the first layer pad 14, and the lead 16 are disposed in the stated order in a thickness direction of the semiconductor dies 11, 12. In other words, the pads 14, 15 and the lead 16 are disposed in a stepwise manner from the second layer pad 15 to the lead 16. In addition, the second layer pad 15 as the third bonding point is disposed at a position in a direction different from a direction toward the lead 16 as the second bonding point centering the first layer pad 14 as the first bonding point.

A first layer pressing portion 100 is provided on the first layer pad 14. The first layer pressing portion 100 includes a pressure-bonded ball 17 formed in ball bonding, a crushed portion 21 formed by crushing a ball neck formed in the ball bonding, and a deformed-folded portion 19 formed by folding a wire onto the crushed portion 21 and then being deformed in bonding of a second wire. A first wire 25 extends from the first layer pressing portion 100 toward the lead 16. The first wire 25 extends horizontally from the first layer pressing portion 100 to a first kink 37 along the surface of the pad 14, bends in a thickness direction of the first-layer semiconductor die 11 at the first kink 37, and is joined to the lead 16 at a joining surface 36.

A second layer pressing portion 200 is provided on the second layer pad 15. The second layer pressing portion 200 includes a pressure-bonded ball 18 formed in ball bonding, a crushed portion 22 formed by crushing a ball neck formed in the ball bonding, and a folded portion 20 formed by folding the wire onto the crushed portion 22. A second wire 26 extends from the second layer pressing portion 200 to the first layer pad 14. The second wire 26 extends horizontally from the second layer pressing portion 200 to a second kink 39 along the surface of the pad 15, bends in the thickness direction of the second-layer semiconductor die 12 at the second kink 39, and is joined to the first layer pressing portion 100 at a joining surface 29 which is an upper surface of the deformed-folded portion 19 on a side toward the second layer pad 15.

In this manner, the first wire 25 and the second wire 26 sequentially connect between the first layer pad 14 and the lead 16 and between the first layer pad 14 and the second layer pad 15, respectively. Further, the first layer pressing portion 100, the second layer pressing portion 200, the first wire 25, and the second wire 26 are all constituted by gold wires.

Figure 2:
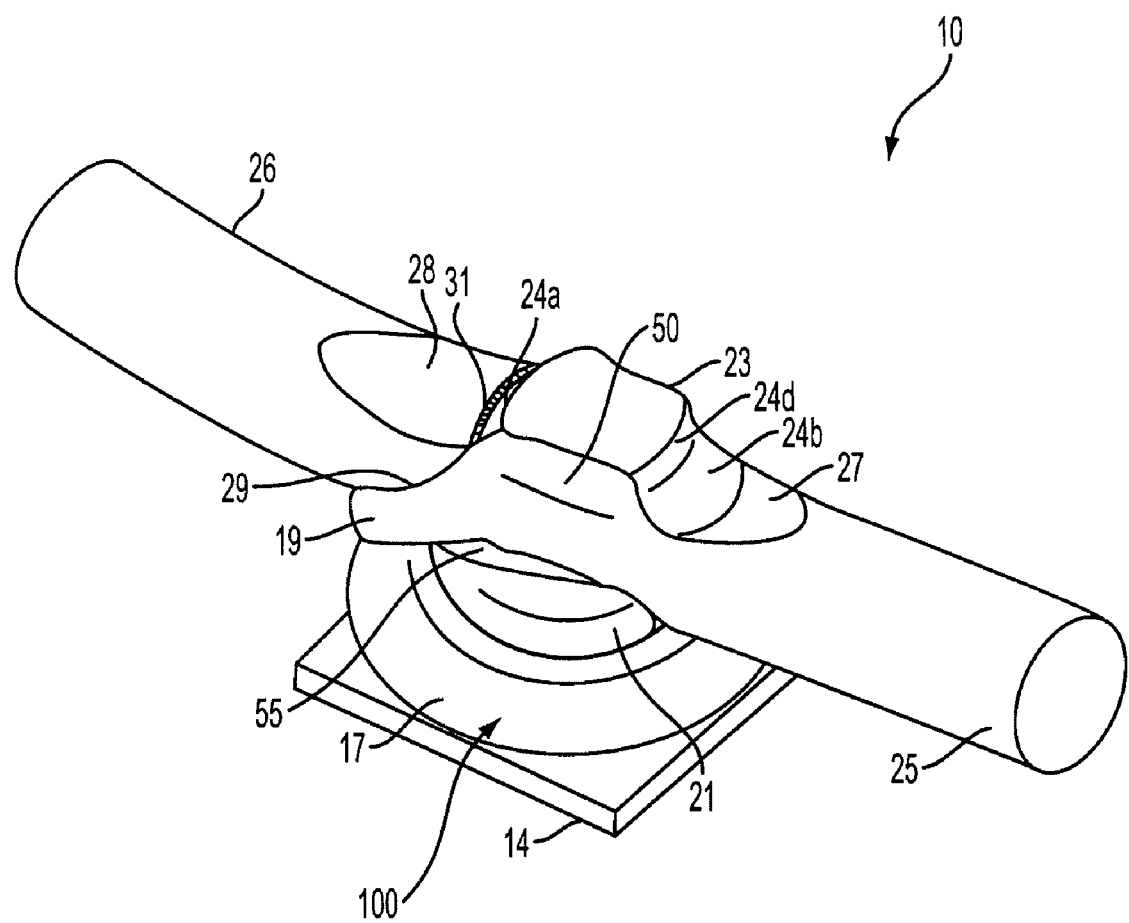
FIG. 2 is a perspective view illustrating a pressing portion, a first wire that extends from the pressing portion, and a second wire that is bonded to the pressing portion in the semiconductor device of the embodiment according to the present invention.
Figure 3:
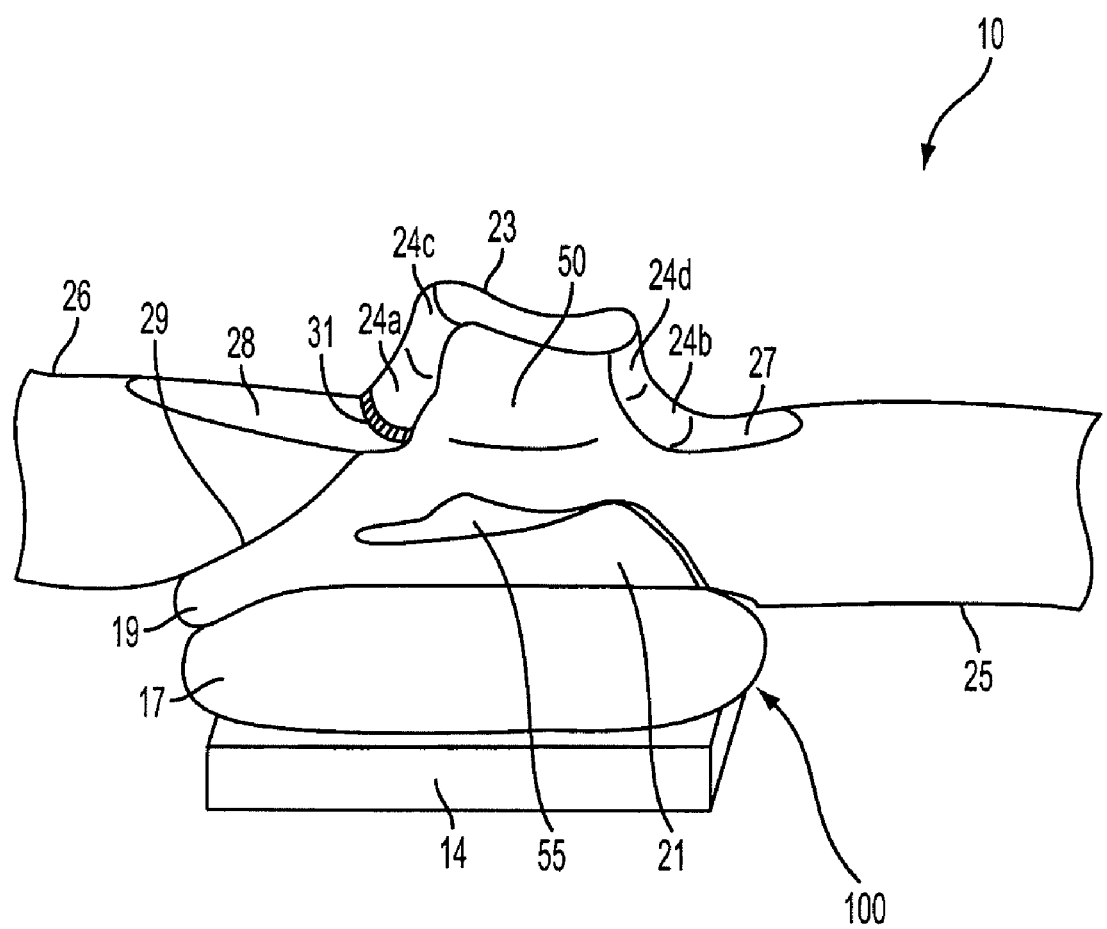
FIG. 3 is a perspective view illustrating the pressing portion, the first wire that extends from the pressing portion, and the second wire that is bonded to the pressing portion in the semiconductor device of the embodiment according to the present invention.

As shown in FIG. 2 and FIG. 3, the first layer pressing portion 100 has a projected portion 23 that is formed by a pressing force of a capillary when bonding the second wire 26 at a center. The projected portion 23 includes tapered surfaces 24a, 24b each formed in a circular truncated conical shape whose diameter decreases toward its top respectively on sides of the first wire 25 and the second wire 26, and cylindrical surfaces 24c, 24d each extends upward continuously from the tapered surfaces 24a, 24b. Further, upper surfaces respectively of the first wire 25 and the second wire 26 that continue from the projected portion 23 have flat portions 27, 28, respectively, formed by pressing with a face portion of a tip end of the capillary.

As shown in FIG. 2, the pressure-bonded ball 17 formed on the first layer pad 14 is in a disk shape. As shown in FIG. 3, the crushed portion 21 is formed on the pressure-bonded ball 17 on a side facing to the first wire 25, and the deformed-folded portion 19 is formed on the pressure-bonded ball 17 at a position on a side facing away from the first wire 25. Further, a side surface 50 in a direction along the first wire 25 of the projected portion 23 is substantially cylindrical similarly to a side surface of the first wire 25. A very small gap 55 that is provided when the first layer pressing portion 100 is formed by folding back the wire is disposed between the projected portion 23 and the crushed portion 21.

As shown in FIG. 3, a cut surface 31 of the second wire 26 is formed at a base portion of the projected portion 23 along the tapered surface 24a.

Next, the following describes a method of bonding between the first layer pad 14 and the lead 16 and between the first layer pad 14 and the second layer pad 15 in the semiconductor device 10 with reference to FIG. 4 through FIG. 17.

Figure 4:
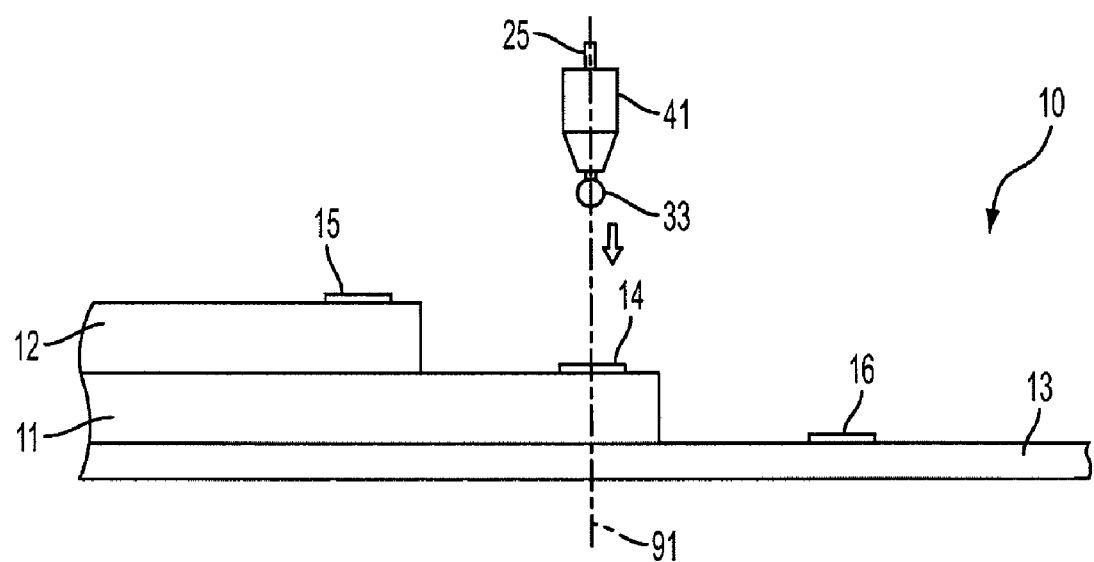
FIG. 4 is a view illustrating ball bonding of the semiconductor device of the embodiment according to the present invention.

As shown in FIG. 4, an initial ball 33 is formed by discharging at a tip end of the first wire 25 that protrudes from a tip or lower end of a capillary 41 or by such as a flame off probe. Then, a ball bonding step of forming the pressure-bonded ball 17 that is in a disk shape and a ball neck 51 as shown in FIG. 5(a) is performed by moving the capillary 41 downward to cause the initial ball 33 to be pressure-bonded to the first layer pad 14.

Figure 5A:
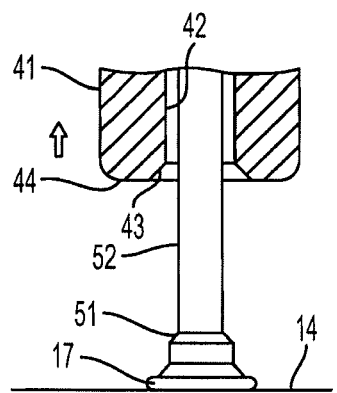
FIG. 5 is a view illustrating a crushing step and a pressing step in a bonding process of the semiconductor device of the embodiment according to the present invention.
Figure 5B:
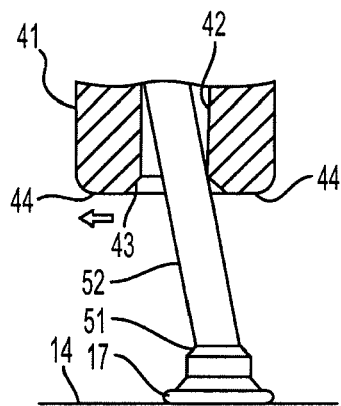
Figure 5C:
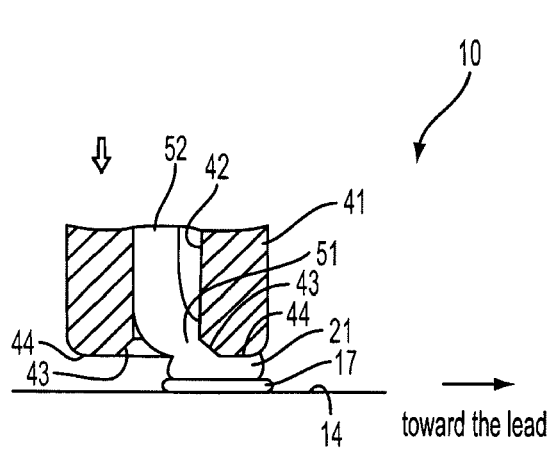

As shown in FIG. 5(a) to FIG. 5(c), after forming the pressure-bonded ball 17 and the ball neck 51 in the ball bonding step, a crushing step for crushing the ball neck 51 with the capillary 41 starts. In the crushing step, as shown in FIG. 5(a), after the capillary 41 is moved upward while feeding a wire 52 that continues after the ball neck 51, as shown in FIG. 5(b), the capillary 41 is moved toward the direction facing away from the lead 16 until a face portion 44 of the capillary 41 on a side of the lead 16 comes above the ball neck 51. At this time, the wire 52 above the ball neck 51 leans toward the direction facing away from the lead 16. Then, as shown in FIG. 5(c), the capillary 41 is moved downward to crush the ball neck 51 with the face portion 44 of the capillary 41, thereby forming the crushed portion 21 on the pressure-bonded ball 17. An upper surface of the crushed portion 21 constitutes a flat surface that fits a shape of the face portion 44, as being crushed with the face portion 44 of the capillary 41. Moreover, the wire 52 is bent toward the side facing away from the lead 16 centering the crushed portion 21, and extends along an inner surface of the straight hole 42 of the capillary 41 on the side facing away from the lead 16 in a direction perpendicular to the first layer pad 14. In this manner, the crushing step ends when the crushing of the ball neck 51 with the capillary 41 is done.

Figure 5D:
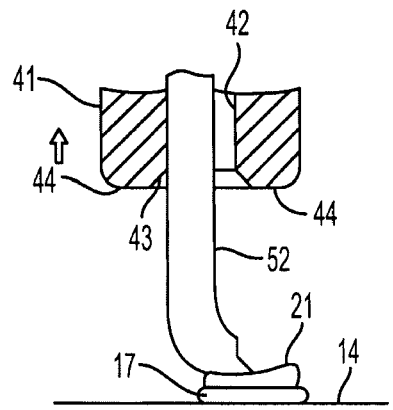
Figure 5E:
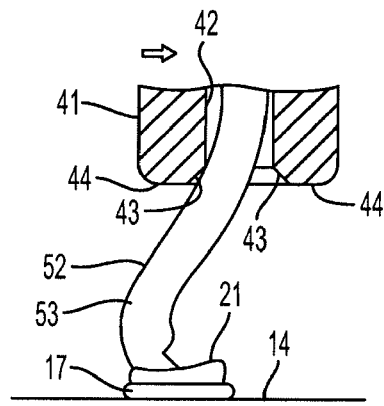
Figure 5F:
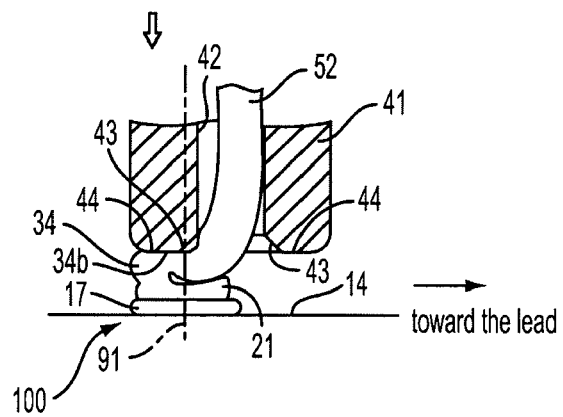

Subsequently, a pressing step starts as shown in FIG. 5(d) through FIG. 5(f). In the pressing step, as shown in FIG. 5(d), the capillary 41 is moved upward while feeding the wire 52 again. Then, the wire 52 is fed linearly along a straight hole 42 of the capillary 41. Subsequently, as shown in FIG. 5(e), the capillary 41 is moved toward the lead 16. Then, the wire 52 is pressed toward the lead 16 by an inner chamfer portion 43 of the capillary 41, and bent at a curving portion 53 that continues after the crushed portion 21. Thereafter, the capillary 41 is moved toward the lead 16 until a position at which the face portion 44 of the capillary 41 on the side facing away from the lead 16 comes above the pressure-bonded ball 17. Then, as shown in FIG. 5(f), the capillary 41 is moved downward, and presses a side surface of the wire 52 onto the crushed portion 21 formed by crushing the ball neck 51. By this pressing of the wire 52, the curving portion 53 of the wire 52 is folded back toward the crushed portion 21 to form a folded portion 34, and thus the pressing step ends. An upper surface of the first layer pressing portion 100 is made into a flat surface by the face portion 44 of the capillary 41. In a state in which the pressing portion forming step is completed, the capillary 41 is at a position closer to the lead 16 centering a bonding center line 91 of the first layer pad 14.

Figure 6:
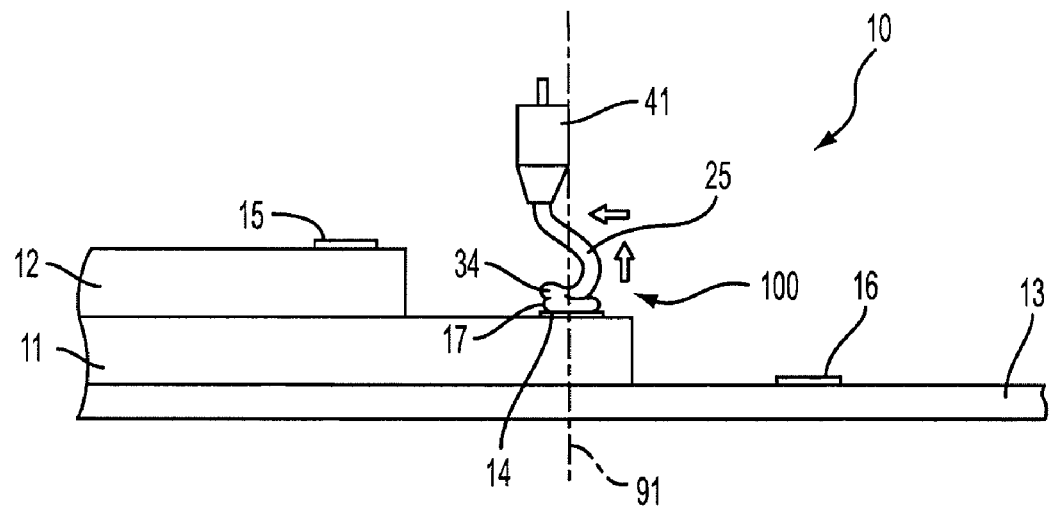
FIG. 6 is a view illustrating feeding of a wire in the bonding process of the semiconductor device of the embodiment according to the present invention.

Upon completion of the pressing step, a first wire forming step starts. As shown in FIG. 6, reverse movement is performed in which the capillary 41 is moved toward the direction facing away from the lead 16 after moving the capillary 41 upward while feeding the first wire 25 from a tip or lower end of the capillary. With the reverse movement, the capillary 41 is at a position above the first layer pad 14 in the direction facing away from the lead 16 centering the bonding center line 91. In a state in which the reverse movement is completed, the first wire 25 leans from the first layer pad 14 toward the direction facing away from the lead 16. In contrast, as the first wire 25 is held by the capillary 41 substantially vertically along the surface of the first layer pad 14, a curved kink that projects toward the direction facing away from the lead 16 is formed in the first wire 25 near a tip end of the capillary 41 in the state in which the reverse movement is completed.

Figure 7:
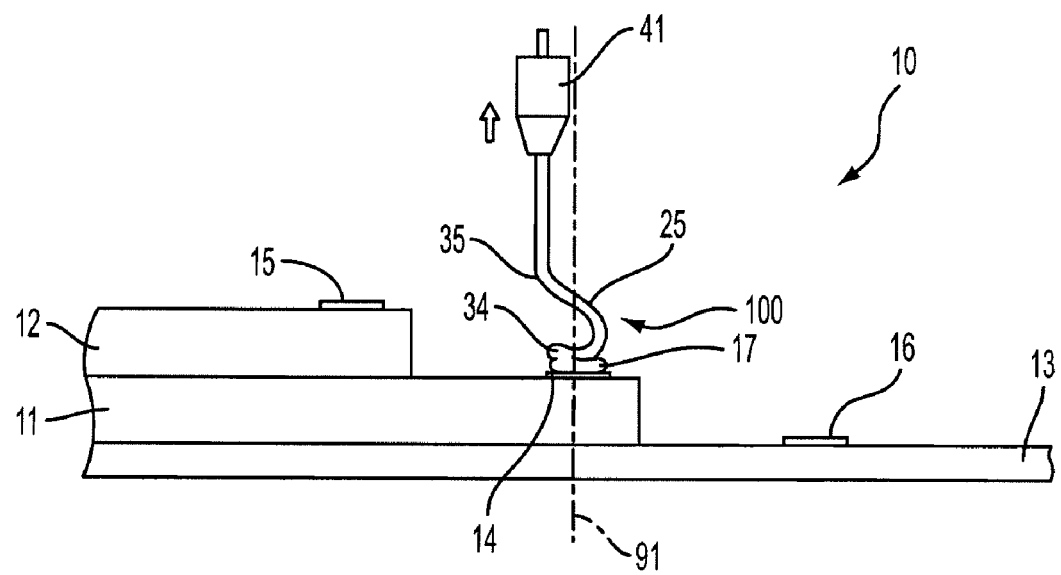
FIG. 7 is a view illustrating feeding of the wire in the bonding process of the semiconductor device of the embodiment according to the present invention.

Subsequent to the reverse movement, a kink forming operation is performed. As shown in FIG. 7, as the first wire 25 includes the kink projecting toward the direction facing away from the lead 16 formed in the reverse movement, a curving portion 35 is formed by upward movement of the capillary 41 when the capillary 41 is moved upward while feeding the first wire 25. The first wire 25 that is fed by this upward movement of the capillary 41 is longer than the wired that has been fed in the reverse movement.

Figure 8:
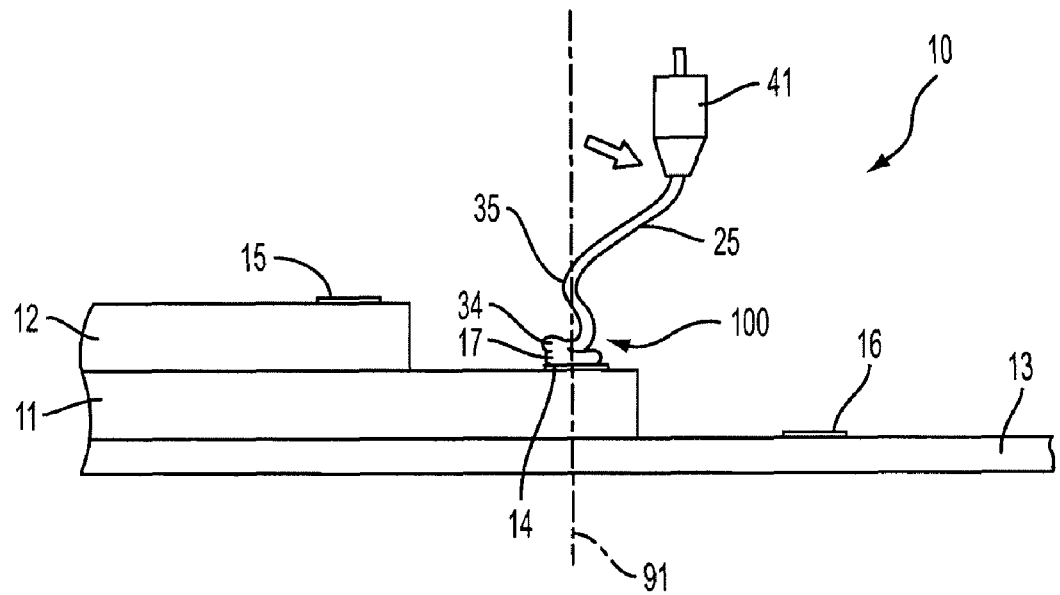
FIG. 8 is a view illustrating looping of the wire to a lead in the bonding process of the semiconductor device of the embodiment according to the present invention.

Then, as shown in FIG. 8, the capillary 41 is looped across the bonding center line 91 above the first layer pad 14 toward the lead 16. By this looping, the first wire 25 extends from the first layer pad 14 toward the lead 16, and then the first wire forming step ends.

Figure 9:
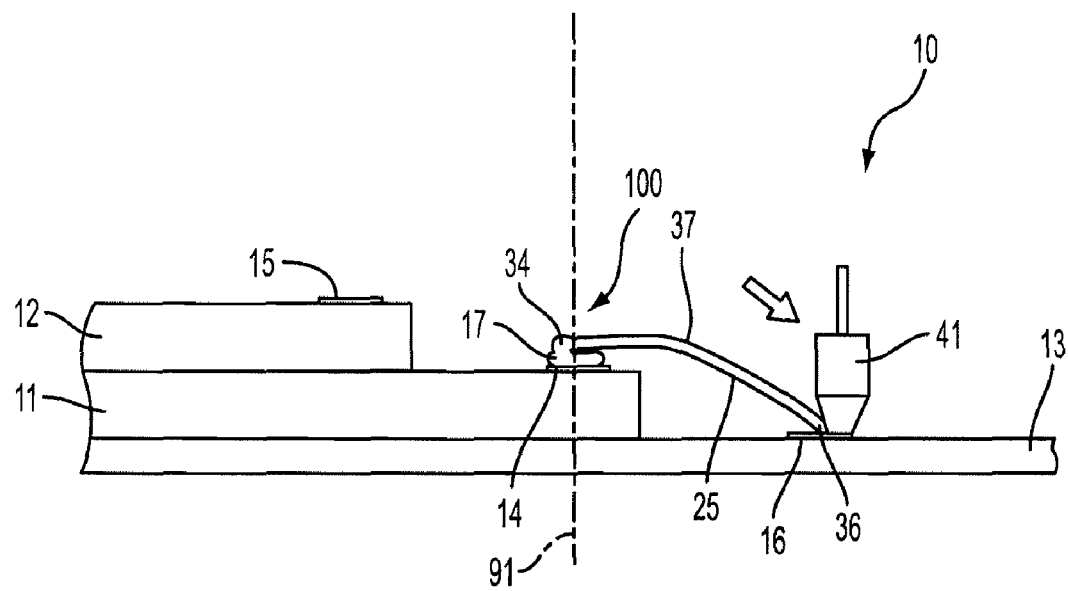
FIG. 9 is a view illustrating bonding to the lead in the bonding process of the semiconductor device of the embodiment according to the present invention.

Subsequently, as shown in FIG. 9, after the capillary 41 is moved above the lead 16, the capillary 41 is moved downward toward the lead 16, and the first wire 25 is stitch-bonded to the lead 16. By the stitch bonding, the first wire 25 is joined to the lead 16 at the joining surface 36, the first kink 37 that bends downward from the surface of the first layer pad 14 toward the lead 16 is formed in the first wire 25 between the first layer pad 14 and the lead 16. Further, the first wire 25 between the first layer pad 14 and the first kink 37 is formed along the surface of the first layer pad 14.

Figure 10:
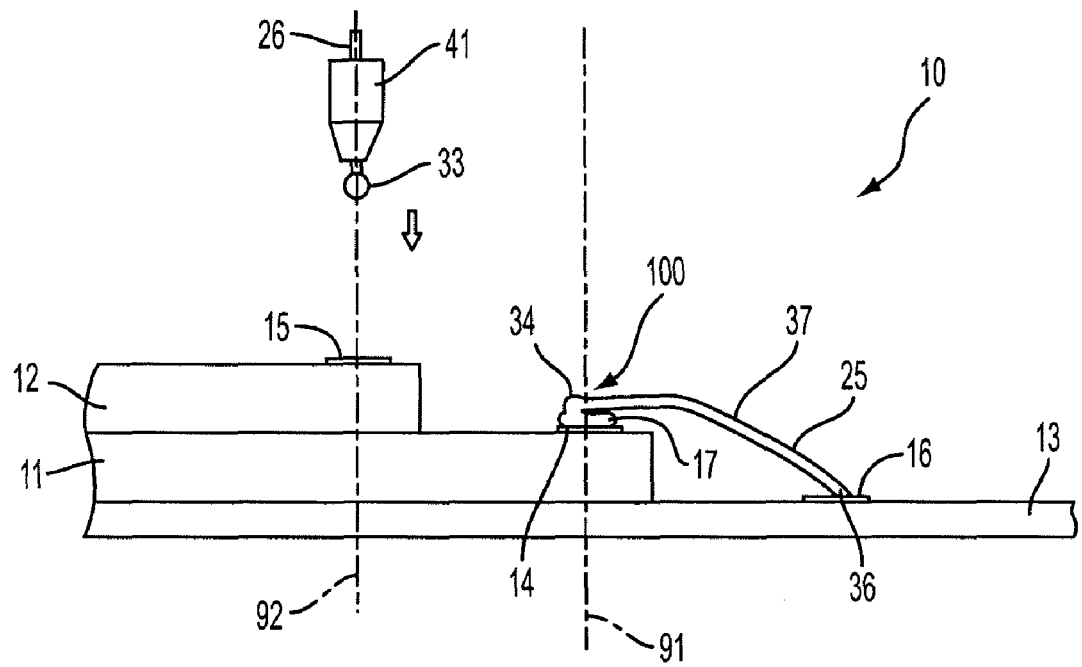
FIG. 10 is a view illustrating ball bonding of the semiconductor device of the embodiment according to the present invention.

Upon completion of the bonding between the first layer pad 14 and the lead 16, a second wire joining step for bonding between the second layer pad 15 and the first layer pad 14 starts. As shown in FIG. 10, the initial ball 33 is formed by discharging at a tip end of the second wire 26 that extends from the tip or lower end of the capillary 41 or by such as a flame off probe. Then, the ball bonding step of forming the pressure-bonded ball 17 that is in the disk shape and the ball neck 51 as shown in FIG. 5(a) is performed, similarly to the bonding to the first layer pad 14, by moving the capillary 41 downward to cause the initial ball 33 to be pressure-bonded to the second layer pad 15.

Figure 11:
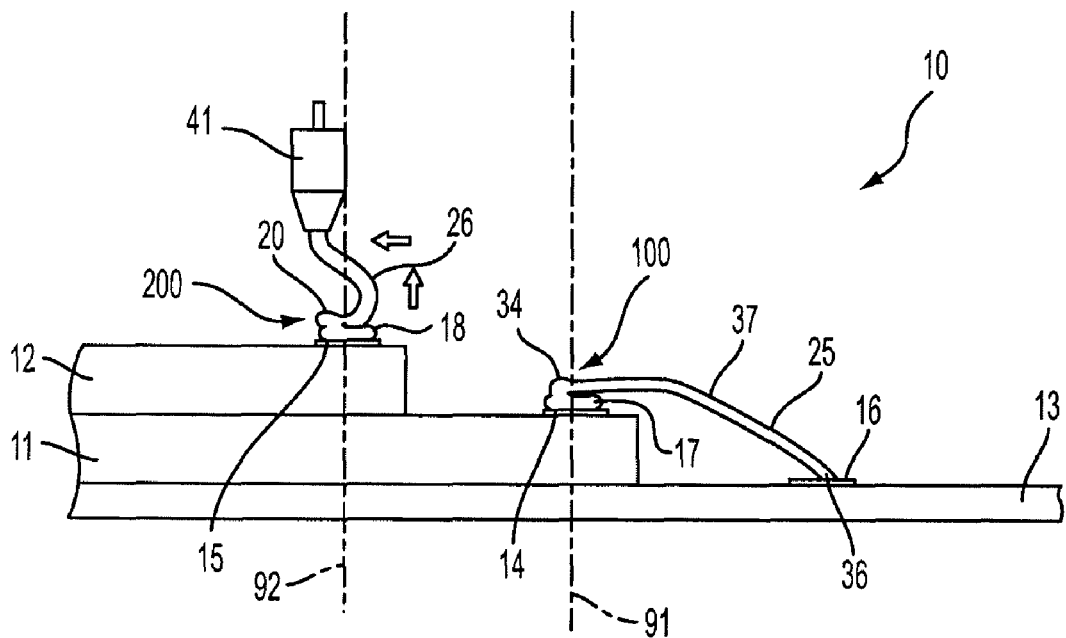
FIG. 11 is a view illustrating feeding of the wire in the bonding process of the semiconductor device of the embodiment according to the present invention.

After the ball bonding, the capillary 41 is moved to form the crushed portion and the pressing portion similarly to the bonding to the first layer pad 14 as described previously with reference to FIG. 5(a) through FIG. 5(f), and the second layer pressing portion 200 that includes the folded portion 20 on the pressure-bonded ball 18 is formed on the second layer pad 15 as shown in FIG. 11.

After the second layer pressing portion 200 is formed, similarly to the bonding of the first wire 25 from the first layer pad 14 to the lead 16, the reverse movement in which the capillary 41 is moved toward a direction facing away from the first layer pad 14 after the capillary 41 is moved upward while feeding the second wire 26 from the tip or lower end of the capillary 41 is performed as shown in FIG. 11. This forms a curved kink that projects toward the direction facing away from the first layer pad 14 in the second wire 26 near the tip end of the capillary 41.

Figure 12:
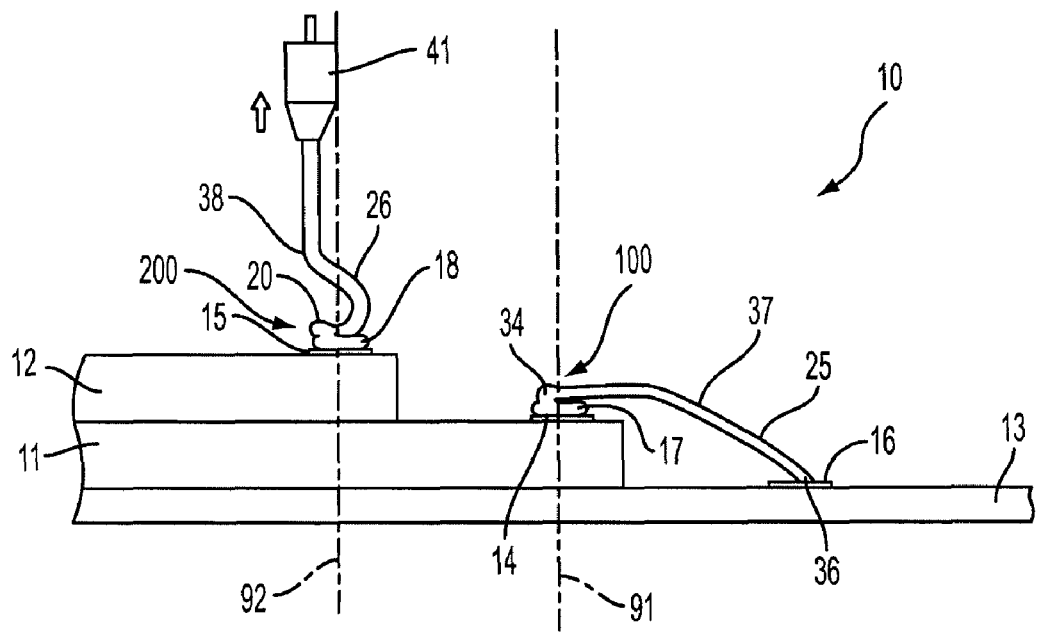
FIG. 12 is a view illustrating feeding of the wire in the bonding process of the semiconductor device of the embodiment according to the present invention.
Figure 13:
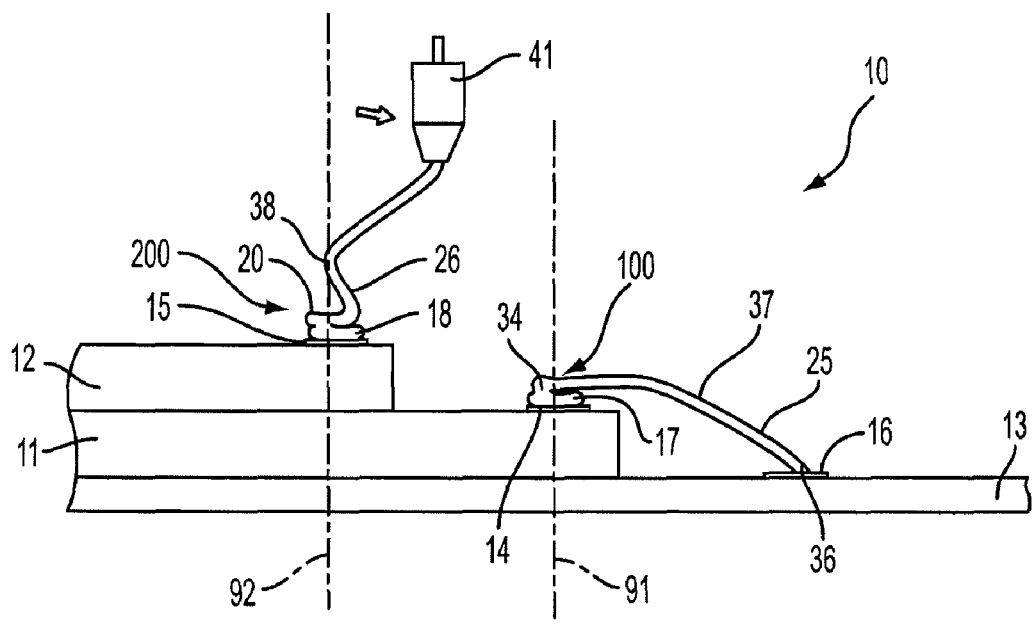
FIG. 13 is a view illustrating looping of the wire to the pressing portion in the bonding process of the semiconductor device of the embodiment according to the present invention.

Then, similarly to the bonding of the first wire 25 as previously described, the capillary 41 is moved upward while feeding the second wire 26 to form a curving portion 38 in the second wire 26 as shown in FIG. 12, and the capillary 41 is looped across a bonding center line 92 above the second layer pad 15 toward the first layer pad 14 as shown in FIG. 13. By this looping, the second wire 26 extends from the second layer pad 15 toward the first layer pad 14.

Figure 14:
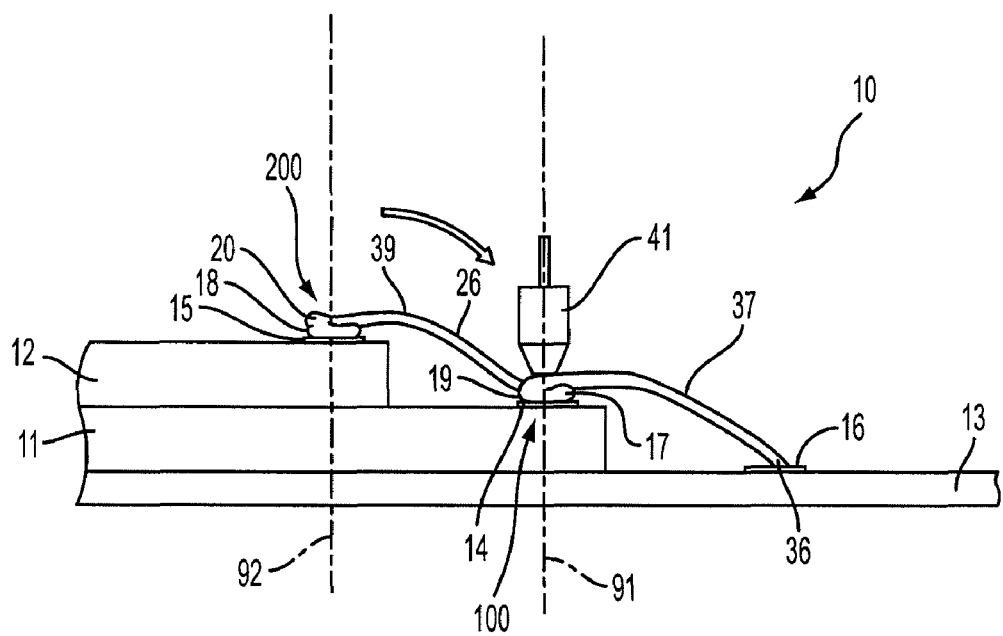
FIG. 14 is a view illustrating bonding to the pressing portion in the bonding process of the semiconductor device of the embodiment according to the present invention.

Subsequently, as shown in FIG. 14, after moving the capillary 41 to a position above the first layer pad 14 such that a center of the capillary 41 comes at the bonding center line 91 of the first layer pad 14, the capillary 41 is moved downward toward the first layer pad 14, and the second wire 26 is bonded onto the folded portion 34 of the first layer pressing portion 100 formed on the first layer pad 14 on the side toward the second layer pad 15.

Figure 15:
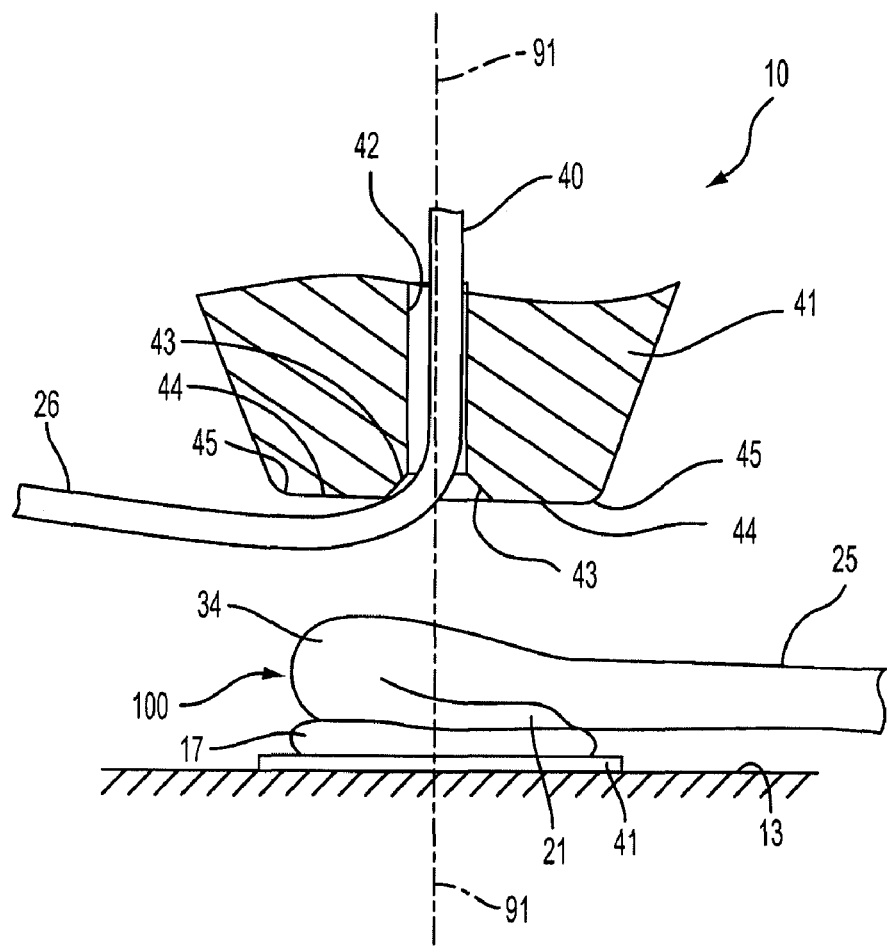
FIG. 15 is a view illustrating bonding to the pressing portion in the bonding process of the semiconductor device of the embodiment according to the present invention.

The bonding of the second wire 26 to the first layer pressing portion 100 is described in detail with reference to FIG. 15 and FIG. 16. FIG. 15 shows a state before the capillary 41 is moved downward for bonding after the capillary 41 is moved such that the center of the capillary 41 comes at the position of the bonding center line 91 of the first layer pad 14. As shown in FIG. 15, the second wire 26 extends from the second layer pad 15 along the face portion 44 on the tip or lower end surface of the capillary 41 and the inner chamfer portion 43 into the straight hole 42, and continues upward along an inner surface of the straight hole 42 on the side of the first layer pad 14. The first layer pressing portion 100 that includes the crushed portion 21 and the folded portion 34 on the pressure-bonded ball 17 is formed on the first layer pad 14, and the first wire 25 extends from the first layer pressing portion 100 toward the lead 16 along the surface of the first layer pad 14.

Figure 16:
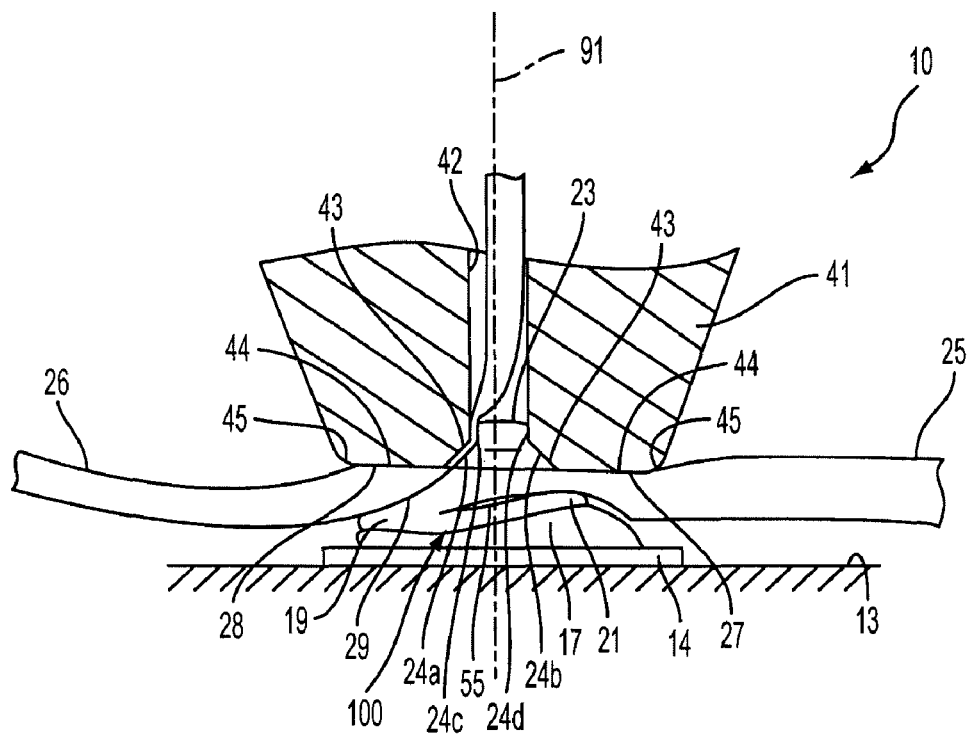
FIG. 16 is a view illustrating bonding to the pressing portion in the bonding process of the semiconductor device of the embodiment according to the present invention.

As shown in FIG. 16, when the capillary 41 is moved downward from the state shown in FIG. 15, the face portion 44 of the capillary 41 on the side toward the second layer pad 15 first sandwiches the second wire 26 extending from the second layer pad 15 between the face portion 44 and an upper surface of the folded portion 34 of the first layer pressing portion 100. Then, as the capillary 41 is further moved downward to apply a pressing force against the second wire 26, the second wire 26 is pressure-bonded between the face portion 44 and the folded portion 34. Further, the upper surface of the folded portion 34 is deformed due to the pressing force of the capillary 41 at this time, and the folded portion 34 is formed into the deformed-folded portion 19. Then, when the pressing force of the capillary 41 is further applied, the second wire 26 is joined to the upper surface of the deformed-folded portion 19, thereby forming the joining surface 29. The joining surface 29 is configured as a slanted surface that extends from a tip end of the deformed-folded portion 19 toward the center of the first layer pressing portion 100. Moreover, an upper surface of the second wire 26 with which the face portion 44 is brought into contact is deformed into a flat surface that fits a shape of the face portion 44 due to the pressing force of the capillary 41, thereby forming the flat portion 28. A side of the flat portion 28 facing toward the second layer pad 15 is formed into a curved shape by an outer radius portion 45 of the capillary 41 and continues to a side surface of the second wire 26.

Further, when the capillary 41 presses the second wire 26 against the upper surface of the first layer pressing portion 100, the second wire 26 is sandwiched between the inner chamfer portion 43 of the capillary 41 and the first layer pressing portion 100. The first layer pressing portion 100 is harder than the second wire 26 due to work hardening as the first layer pressing portion 100 is formed by folding back the wire. That is, the second wire 26 is softer than the first layer pressing portion 100. Moreover, the inner chamfer portion 43 is defined by a tapered surface formed such that a diameter of the inner chamfer portion 43 decreases from the tip or lower end of the capillary 41 toward the straight hole 42 above the inner chamfer portion 43, and the surface area is smaller than the face portion 44. Accordingly, the second wire 26 sandwiched between the inner chamfer portion 43 and the first layer pressing portion 100 due to the pressing force of the capillary 41 is applied with a greater compression force than that applied to the second wire 26 sandwiched between the face portion 44 and the first layer pressing portion 100, and the second wire 26 that is softer than the first layer pressing portion 100 is compressed between the inner chamfer portion 43 and the first layer pressing portion 100 to be formed such that the cross-sectional area of the second wire 26 is reduced.

Furthermore, as the first layer pressing portion 100 is formed by a gold wire, the first layer pressing portion 100 is softer than the capillary 41, which is made of ceramic and such. Accordingly, when the capillary 41 is moved downward along of the bonding center line 91 of the first layer pad 14, the inner chamfer portion 43 bites into the upper surface of the first layer pressing portion 100, the upper surface of the first layer pressing portion 100 deforms and intrudes into the inner chamfer portion 43 to form the projected portion 23, and a side surface of the projected portion 23 is provided with the tapered surfaces 24a, 24b that fit along a shape of the inner chamfer portion 43. The second wire 26 is effectively compressed to reduce its cross-sectional area as it is compressed by being sandwiched between the tapered surface 24a of the projected portion 23 that intrudes into the inner chamfer portion 43 on the side toward the second layer pad 15 and the inner chamfer portion 43 so as not to be able to escape. In particular, as a compression force concentrates on the base portion of the projected portion 23 with which a corner portion between the inner chamfer portion 43 and the face portion 44 is brought into contact, the second wire 26 that is sandwiched between this portion and the base portion of the projected portion 23 is compressed such that the cross-sectional area of the second wire 26 becomes minimum.

Then, by a force in an oblique direction that is applied by a plane of the inner chamfer portion 43, a force that is directed toward the bonding center line 91 is produced at the center of the first layer pressing portion 100. Due to this force, the projected portion 23 is further deformed such that the projected portion 23 is pushed up into the straight hole 42 of the capillary 41, and the side surface of the projected portion 23 is formed into the cylindrical surfaces 24c, 24d that fit a shape of the straight hole 42.

The cylindrical surface 24c on the side toward the second layer pad 15 is formed in a direction that is substantially parallel with the straight hole 42 of the capillary 41, and therefore not applied with the pressing force by the capillary 41. Accordingly, while the second wire 26 is more or less compressed between the straight hole 42 and the cylindrical surface 24c on the side toward the second layer pad 15, the second wire 26 is not joined to the cylindrical surface 24c.

At the same time with joining of the second wire by the downward movement of the capillary 41, the face portion 44 of the capillary 41 on the side toward the lead 16 presses an upper surface of the first wire 25, and the upper surface of the first wire 25 is formed into the flat portion 27 in a flat surface along the shape of the face portion 44.

In the state in which the bonding of the second wire 26 to the first layer pressing portion 100 is completed, as described above, the second wire 26 is joined to the first layer pressing portion 100 at the joining surface 29 on the side toward the second layer pad 15, the projected portion 23 is formed at the center of the first layer pressing portion 100, the second wire 26 between the inner chamfer portion 43 of the capillary 41 and the tapered surface 24a of the projected portion 23 on the side toward the second layer pad 15 is compressed, and the upper surfaces of the first wire 25 and the second wire 26 are respectively formed into the flat portions 27, 28. In addition, the compressed second wire 26 extends upwardly along the straight hole 42.

Figure 17:
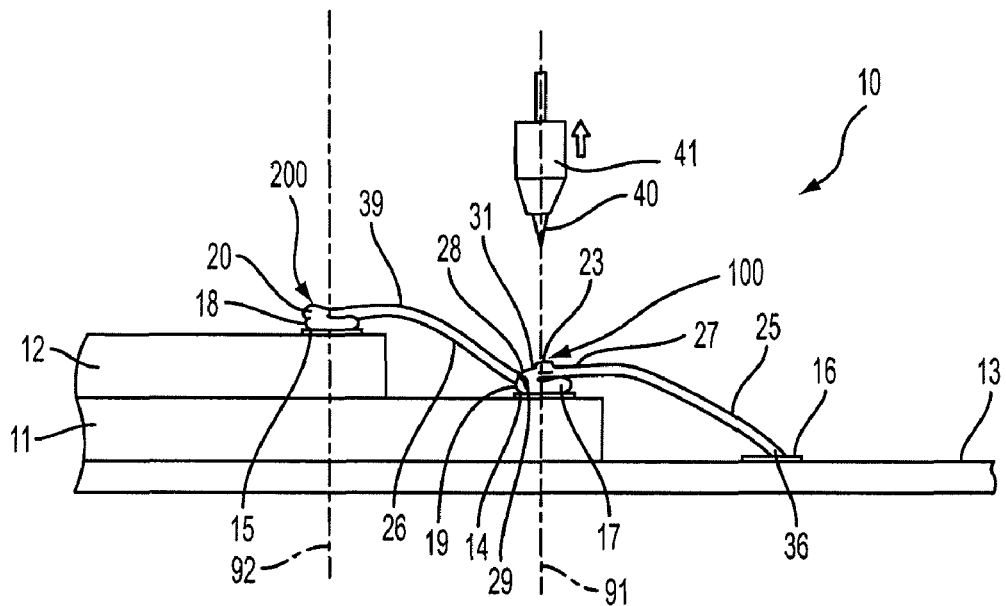
FIG. 17 is a view illustrating an operation of cutting the wire in the bonding process of the semiconductor device of the embodiment according to the present invention.

As shown in FIG. 17, upon completion of the second wire connecting step, the capillary 41 is moved upward and a tail wire 40 is formed by causing the second wire 26 to extend from the tip or lower end of the capillary 41, and then the capillary 41 along with the second wire 26 is moved further upward. This causes the second wire 26 to be cut at the compressed portion whose cross-sectional area is the smallest and that is sandwiched between the corner portion between the inner chamfer portion 43 and the face portion 44 and the base of the projected portion 23, and the tail wire 40 remains extending from the tip or lower end of the capillary. Accordingly, the cut surface 31 of the second wire 26 is formed at the base portion of the projected portion 23 along the tapered surface 24a as shown in FIG. 2 and FIG. 3.

According to the semiconductor device 10 of this embodiment as described above, the second wire is bonded onto the first layer pressing portion 100 formed by the gold wire on the first layer pad 14. Therefore, the semiconductor device 10 provides advantageous effects that an impact of the bonding can be reduced due to the deformation of the first layer pressing portion 100, and it is possible to reduce damages caused on the first-layer semiconductor die 11 by the bonding. Further, according to this embodiment, the pads 14, 15 and the lead 16 of the stacked semiconductor device 10 are sequentially connected with a reduced number of steps in the bonding process, i.e., the two steps including the step of connecting the first layer pad 14 and the lead 16 with the first wire 25 and the step of connecting the second layer pad 15 and the first layer pad 14 with the second wire 26. Therefore, this embodiment provides an advantageous effect of reducing the number of steps in the bonding process and the time for bonding. Moreover, as the second wire 26 is effectively compressed as it is compressed by being sandwiched between the tapered surface 24a of the projected portion 23 that intrudes into the inner chamfer portion 43 on the side toward the second layer pad 15 and the inner chamfer portion 43 so as not to be able to escape, such that the cross-sectional area of the compressed portion is far smaller than the cross-sectional area of the second wire 26. Accordingly, it is advantageously possible to cut the second wire 26 with a less tensile force when cutting, and it is possible to prevent deformation of the tail wire and to reduce bonding defects. Furthermore, according to the semiconductor device 10 of this embodiment, it is possible to reduce the height of the semiconductor device 10 as a whole by forming the second layer pressing portion 200 also on the second layer pad 15, thereby providing the low-profile semiconductor device 10.

According to the semiconductor device 10 of this embodiment as described above, the second layer pressing portion 200 is also formed on the second layer pad 15 of the second-layer semiconductor die 12. However, after the ball bonding is performed onto the second layer pad 15, the second wire 26 can be directly looped toward the first layer pressing portion 100 and bonded onto the first layer pressing portion 100 on the side toward the second layer pad 15. In this case, it is advantageously possible to reduce total time for bonding by a time period for forming the second layer pressing portion 200.

Further, according to this embodiment, the semiconductor device 10 is described to have the two-layer stack structure in which the first-layer semiconductor die 11 as the first semiconductor die and the second-layer semiconductor die 12 as the second semiconductor die whose size is smaller than the first-layer semiconductor die 11 are stacked on the lead frame 13 and joined to each other, where the first-layer semiconductor die 11 is provided with the first layer pad 14 as the first bonding point on its surface, the second-layer semiconductor die 12 is provided with the second layer pad 15 as the third bonding point on its surface, the lead frame 13 is provided with the lead 16 as the second bonding point on its surface, and the pads 14, 15 and the lead 16 are disposed in the stepwise manner. However, the semiconductor device 10 can be applied for a semiconductor device in which three or more layers of semiconductor dies are stacked on a lead frame, as long as such a semiconductor device includes three or more bonding points and the third bonding point is positioned in the direction different from the direction of the second bonding point centering the first bonding point.

Figure 18:
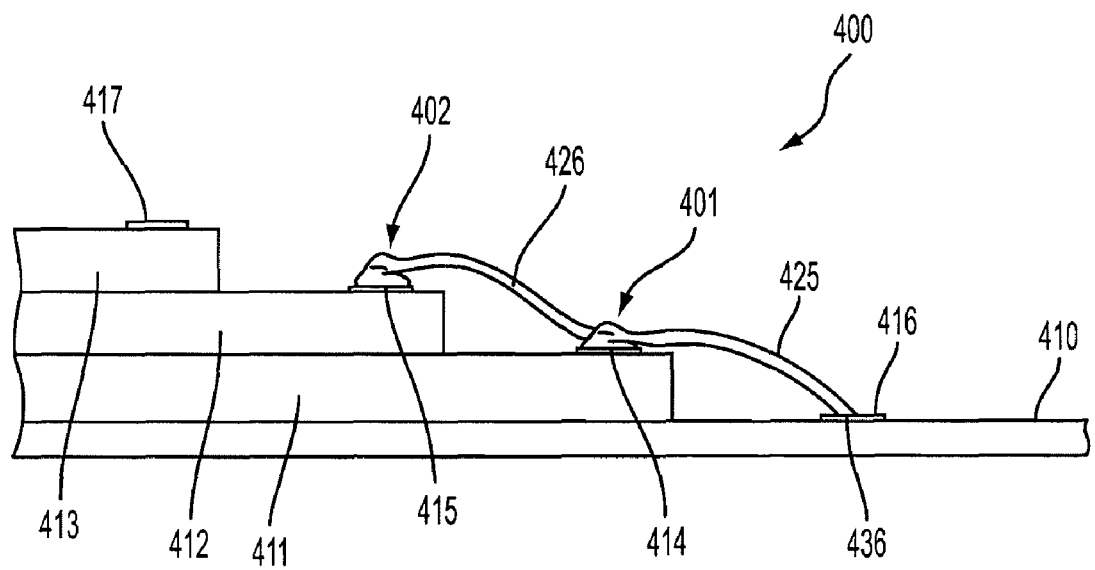
FIG. 18 is a view illustrating bonding between a first layer and a second layer in the bonding process of a three-layer stacked semiconductor device of the embodiment according to the present invention.
Figure 19:
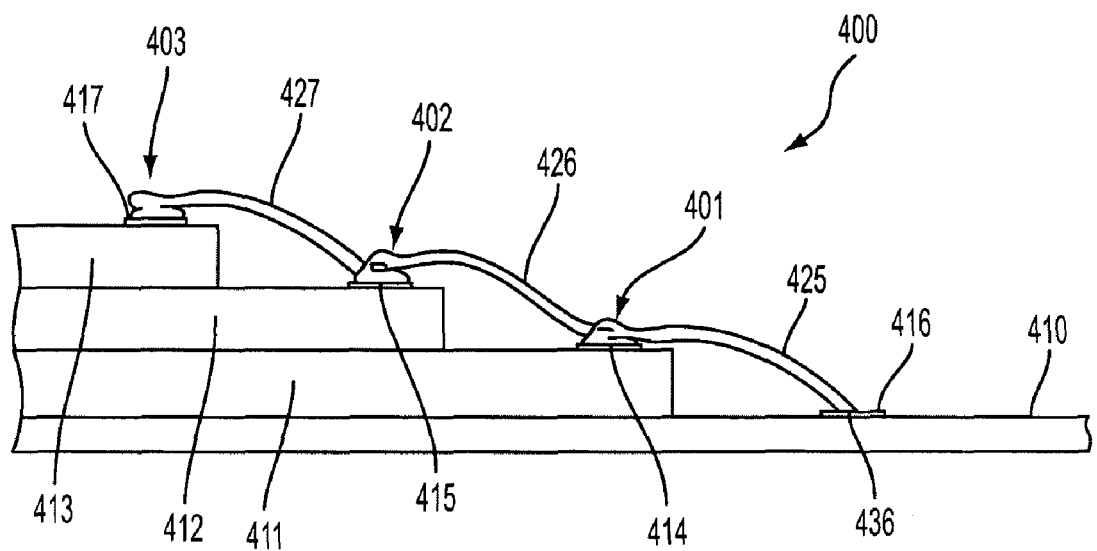
FIG. 19 is a view illustrating bonding between the second layer and a third layer in the bonding process of the three-layer stacked semiconductor device of the embodiment according to the present invention.

Referring to FIG. 18 and FIG. 19, a case in which the bonding is performed to a three-layer stacked semiconductor device is described. Descriptions for the like steps as in the embodiment described referring to FIG. 4 through FIG. 17 are omitted. As shown in FIG. 18, a three-layer stacked semiconductor device 400 includes three layers of a first-layer semiconductor die 411, a second-layer semiconductor die 412, and a third layer semiconductor die 413 stacked in the stated order from a lead frame 410. In the bonding process, a first layer pressing portion 401 is first formed on a first layer pad 414 of the first-layer semiconductor die 411, and the first layer pad 414 and a lead 416 of the lead frame 410 are bonded with a wire 425, then a second layer pressing portion 402 is formed on a second layer pad 415 of the second-layer semiconductor die 412, and a wire 426 is looped to the first layer pressing portion 401 and bonded to the first layer pressing portion 401 on the side toward the second-layer semiconductor die 412. In this bonding, the first-layer semiconductor die 411 is the first semiconductor die, the first layer pad 414 is the first bonding point, the second-layer semiconductor die is the second semiconductor die, the lead 416 is the second bonding point, and the second layer pad 415 of the second-layer semiconductor die 412 is the third bonding point. Further, the wire 425 is the first wire for the first layer pressing portion 401, and the wire 426 is the second wire for the first layer pressing portion 401.

As shown in FIG. 19, upon completion of the bonding between the lead frame 410, the first-layer semiconductor die 411, and the second-layer semiconductor die 412, the bonding between the second-layer semiconductor die 412 and the third-layer semiconductor die 413 is performed. The second layer pressing portion 402 has already been formed on the second layer pad 415, and the second layer pressing portion 402 is connected with the first layer pressing portion 401 by the wire 426. In this state, the second-layer semiconductor die 412 is the first semiconductor die, the second layer pad 415 of the second-layer semiconductor die 412 is the first bonding point, and the wire 426 is the first wire for the second layer pressing portion 402. Further, the first-layer semiconductor die 411 is the second semiconductor die that is adjacent to the second-layer semiconductor die 412 on the side toward the lead frame 410, and the first layer pad 414 of the first-layer semiconductor die 411 is the second bonding point.

Then, a third layer pressing portion 403 is formed on a third layer pad 417 of the third layer semiconductor die 413, and a wire 427 is looped from the third layer pressing portion 403 to a position above the second layer pressing portion 402 and bonded to the second layer pressing portion 402 on the side toward the third layer semiconductor die 413. In this bonding, the third layer semiconductor die 413 is the third semiconductor die, the third layer pad 417 of the third-layer semiconductor die 413 is the third bonding point, and the wire 427 is the second wire for the second layer pressing portion 402.

The bonding for the semiconductor device 400 in which three layers are stacked in the stepwise manner is described with reference to FIG. 18 and FIG. 19. However, the present invention can be similarly applied to a case in which the bonding points are provided in a planar manner, for example, instead of in the stepwise manner, as long as three or more bonding points are provided. Further, it is possible to provide an advantageous effect that, as a number of bonding points increases, the number of steps in the bonding and time required for the bonding are reduced to a large extent, as compared to the conventional technique described in Japanese Patent No. 3573133, for example.

Figure 20:
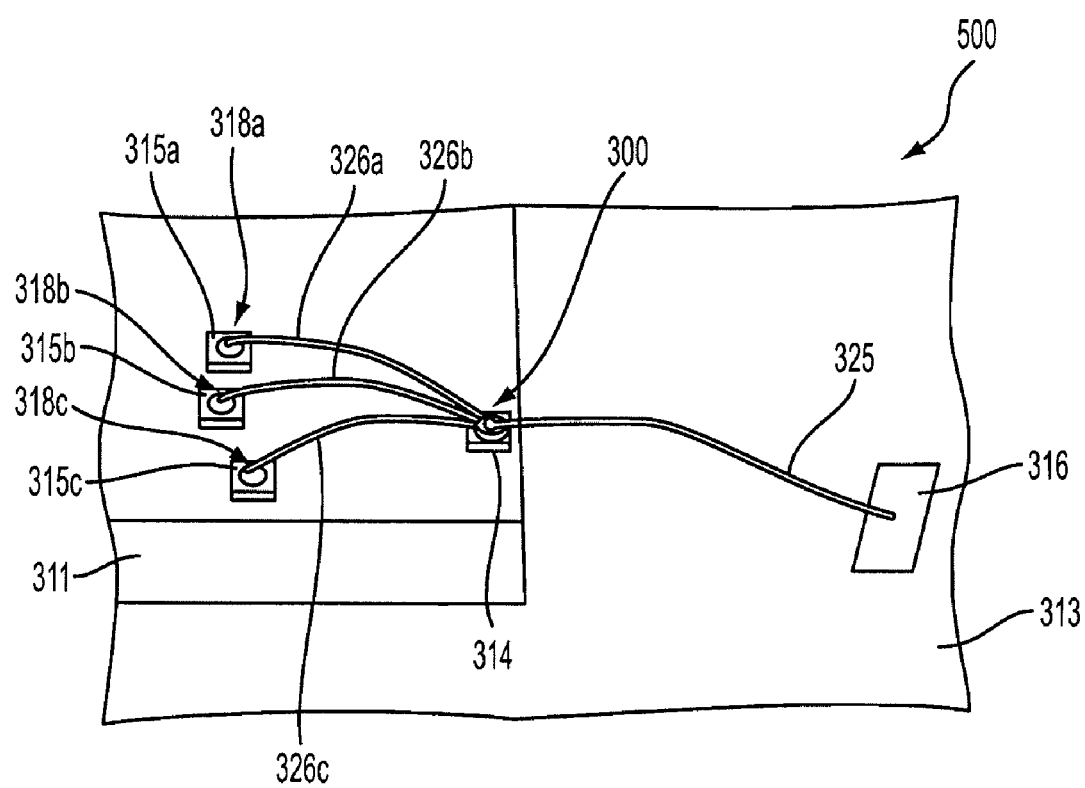
FIG. 20 is a perspective view illustrating the semiconductor device of a different embodiment according to the present invention.
Figure 21:
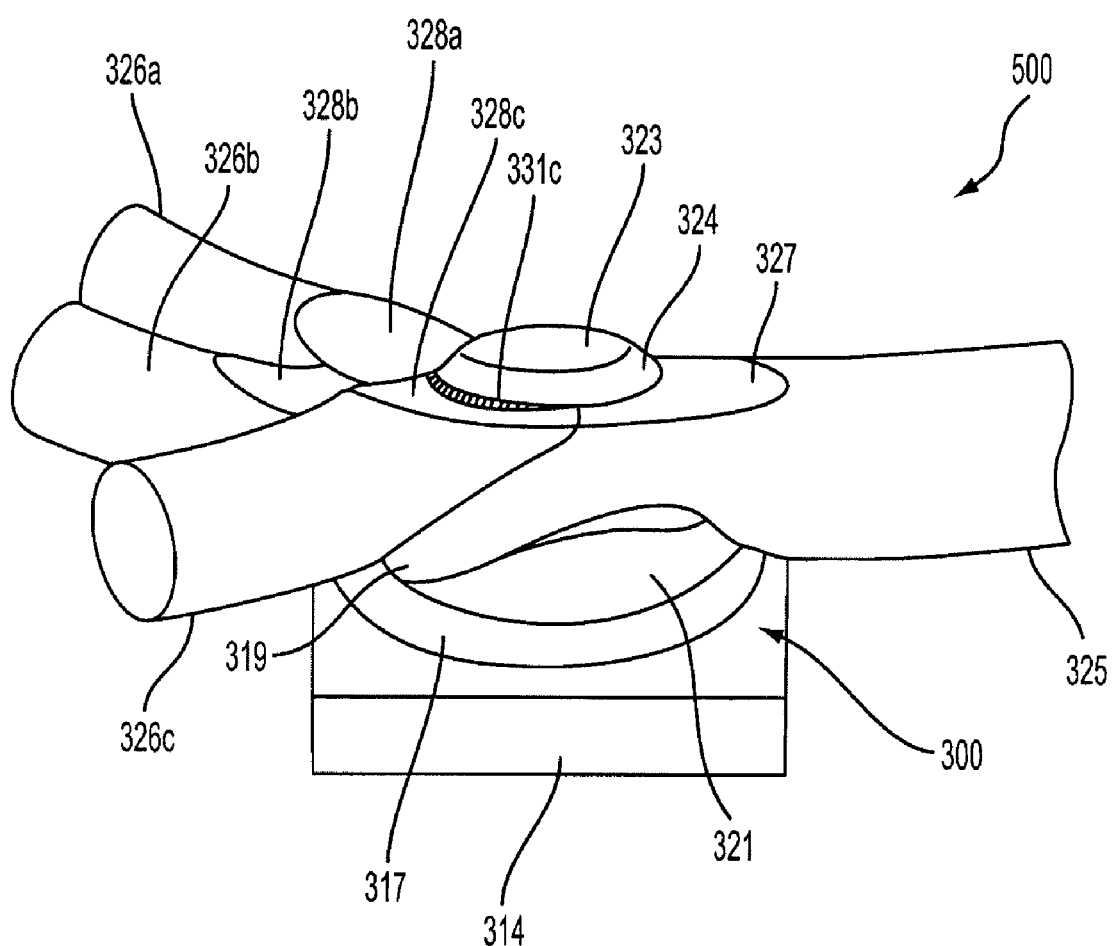
FIG. 21 is a perspective view illustrating a pressing portion, a first wire that extends from the pressing portion, and a plurality of second wires that are bonded to the pressing portion in the semiconductor device of the different embodiment according to the present invention.

Next, another embodiment according to the present invention is described with reference to FIG. 20 and FIG. 21. As shown in FIG. 20, a semiconductor device 500 of this embodiment is such that a semiconductor die 311 is mounted on a lead frame 313, and pads 314, 315a, 315b, 315c provided on a surface of the semiconductor die 311 and a lead 316 provided on the lead frame 313 are connected respectively with a first wire 325 and second wires 326a, 326b, 326c. The second wires 326a, 326b, 326c are bonded to the pressing portion 300 formed on the pad 314.

According to this embodiment, the bonding is performed in the following manner similarly to the embodiment described previously. First, the pressing portion 300 including a pressure-bonded ball 317, a folded portion 319, and a crushed portion 321 shown in FIG. 21 is formed on the pad 314 on the semiconductor die 311 as the first bonding point in the same manner as described referring to FIG. 4 and FIG. 5. Then, the first wire 325 is looped toward the lead 316 as the second bonding point to extend the first wire from the pressing portion 300 toward the lead 316, and is bonded to the lead 316 in the same manner as described referring to FIG. 6 through FIG. 9. Next, a pressure-bonded ball 318a is formed by performing the ball bonding to the pad 315a out of the three pads 315a, 315b, 315c as the third bonding points that are provided at positions in directions different from a direction of the lead 316 as the second bonding point centering the pad 314 as the first bonding point, and then the second wire 326a is looped toward the pressing portion 300 and bonded to the pressing portion 300 on the side toward the pad 315a. Similarly, the pressure-bonded balls 318b, 318c are formed on the pads 315b, 315c, respectively, and the second wires 326b, 326c are looped toward the pressing portion 300 and bonded to the pressing portion 300 on the sides toward the pad 315b and the pad 315c, respectively. In this case, joining portions of the second wires 326b, 326c can be on a joining portion of the second wire 326a that has been bonded earlier. In this manner, the second wires 326a, 326b, 326c looped from the pads 315a, 315b, 315c as the three third bonding points are bonded to the pressing portion 300. The bonding of the second wires 326a, 326b, 326c to the pressing portion 300 is the same as described referring to FIG. 15 and FIG. 16.

A projected portion 323 around which a tapered surface 324 is provided is formed at a center of the pressing portion 300 by the bonding. The cut surfaces 331a (not shown), 331b (not shown), and 331c of the second wires 326a, 326b, 326c are respectively formed between the tapered surface 324 and the flat portions 328a, 328b, 328c formed respectively on the second wires 326a, 326b, 326c.

According to this embodiment, as the second wires 326a, 326b, 326c are bonded to the single pressing portion 300 at different angles in a circumferential direction, the height of the pressing portion 300 after the bonding does not change substantially even if the second wires 326a, 326b, 326c are joined at the same position, and thus an advantageous effect can be provided in which the height of the semiconductor device 500 as a whole is reduced and it is possible to sequentially connect between one of the plurality of pads and the single pad, in addition to the same effects of the embodiments described previously.

What is claimed is:

1. A semiconductor device in which two bonding points out of three or more bonding points are connected with a wire, the semiconductor device comprising:
   a pressing portion that is formed by bonding an initial ball formed at a tip end of a wire that is inserted through a capillary and protrudes from a lower end of the capillary onto a first bonding point that is formed on a semiconductor die, crushing a ball neck formed by the bonding, and pressing a side surface of the wire folded back onto said crushed ball neck;
   a first wire that extends from said pressing portion to a second bonding point; and
   at least one second wire that is looped toward said pressing portion from at least one third bonding point and joined onto said pressing portion by the capillary at a position on a side facing to the corresponding third bonding point, said each third bonding point being provided at a position in a direction different from a direction of said second bonding point centering said first bonding point, wherein
   said pressing portion includes a projected portion at a center thereof, said projected portion being deformed so as to intrude into a center hole of said capillary due to a pressing force of said capillary when joining said each second wire, and
   said second wire is cut along said projected portion.

2. A semiconductor device that includes semiconductor dies that are stacked on a lead frame and that sequentially connect either between pads of adjacent ones formed on the semiconductor dies or between a pad formed on a semiconductor die and a lead of the lead frame with a wire, the semiconductor device comprising:
   a pressing portion that is formed by bonding an initial ball formed at a tip end of a wire that is inserted through a capillary and protrudes from a lower end of the capillary onto a first pad of a first semiconductor die, crushing a ball neck formed by the bonding, and pressing a side surface of the wire folded back onto said crushed ball neck;
   a first wire that extends from said pressing portion to a direction of a second pad of a second semiconductor die that is adjacent on a side facing either to the lead or to the lead frame; and
   a second wire that is looped toward said pressing portion from a third pad of a third semiconductor die and joined onto said pressing portion by the capillary at a position on a side facing to said third pad of the third semiconductor die, the third semiconductor die being adjacent to the first semiconductor die on a side facing away from the lead frame, wherein
   said pressing portion includes a projected portion deformed so as to intrude into a center hole of said capillary due to a pressing force of said capillary when joining said second wire, and
   said second wire is cut along said projected portion.

3. A wire bonding method of connecting two bonding points out of three or more bonding points with a wire, the method comprising:
   a ball bonding step of bonding an initial ball onto a first bonding point formed on a semiconductor die and of forming a ball neck, the initial ball being formed at a tip end of a wire that is inserted through a capillary and protrudes from a lower end of the capillary;
   a crushing step of crushing said ball neck that has been formed in the ball bonding step with a tip end of said capillary;
   a pressing step of folding back the wire on said ball neck that has been crushed by said capillary and pressing a side surface of said wire against said crushed ball neck, thereby forming a pressing portion at said first bonding point;
   a first wire forming step of feeding the wire from said capillary and then looping the wire toward a second bonding point, thereby forming a first wire that is directed toward said second bonding point; and
   a second wire joining step of looping the wire toward a pressing portion from at least one third bonding point, and of joining a second wire onto said pressing portion at a position on a side facing to the corresponding third bonding point, said each third bonding point being provided at a position in a direction different from a direction of said second bonding point centering said first bonding point.

4. The wire bonding method according to claim 3, wherein the second wire joining step includes:
   moving said capillary downward and joining said second wire onto said pressing portion with a face portion of said capillary, deforming said pressing portion having an outer diameter larger than an inner diameter of a center hole of said capillary into a projected portion that intrudes into the center hole of said capillary by the pressing force of said capillary, and sandwiching and compressing said second wire between said projected portion intruded into the center hole of said capillary and an inner chamfer portion of said capillary.

5. A wire bonding method of sequentially connecting either between pads of adjacent ones of semiconductor dies that are stacked on a lead frame or between a pad of a semiconductor die and a lead of a lead frame with a wire, the method comprising:
   a ball bonding step of bonding an initial ball onto a first pad on a first semiconductor die and of forming a ball neck, the initial ball being formed at a tip end of a wire that is inserted through a capillary and protrudes from a lower end of the capillary;

a crushing step of crushing said ball neck that has been formed in the ball bonding step with the tip end of said capillary;

a pressing step of folding back the wire on said ball neck that has been crushed by said capillary and of pressing a side surface of the wire against said crushed ball neck, thereby forming a pressing portion on said first pad;

a first wire forming step of feeding the wire from said capillary and then looping the wire toward a second pad of an adjacent second semiconductor die on a side facing either to the lead or to the lead frame, thereby forming a first wire that is directed either toward said lead or toward said second pad; and a second wire connecting step of looping the wire toward a pressing portion from a third pad of a third semiconductor die, and of joining said second wire onto said pressing portion at a position on a side facing to said third pad, the third semiconductor die being adjacent to said first semiconductor die on a side facing away from the lead frame.

6. The wire bonding method according to claim 5, wherein the second wire connecting step includes:

moving said capillary downward and joining said second wire onto the pressing portion with a face portion of said capillary, deforming said pressing portion having an outer diameter larger than an inner diameter of a center hole of said capillary into a projected portion that intrudes into the center hole of said capillary by the pressing force of said capillary, and sandwiching and compressing said second wire between said projected portion intruded into the center hole of said capillary and an inner chamfer portion of said capillary.

\* \* \* \* \*